(12) United States Patent
Swenton et al.

(10) Patent No.: US 8,120,378 B2
(45) Date of Patent: Feb. 21, 2012

(54) SYSTEM TO CONTROL INSERTION OF CARE-BITS IN AN IC TEST VECTOR IMPROVED OPTICAL PROBING

(75) Inventors: Joseph Swenton, Owego, NY (US); Thomas Bartenstein, Owego, NY (US); Richard Schoonover, Binghamton, NY (US); David Sliwinski, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/873,126

(22) Filed: Aug. 31, 2010

(65) Prior Publication Data

US 2010/0321055 A1  Dec. 23, 2010

Related U.S. Application Data

(60) Division of application No. 12/122,310, filed on May 16, 2008, now Pat. No. 7,821,276, which is a continuation of application No. 11/877,516, filed on Oct. 23, 2007, now abandoned.

(60) Provisional application No. 60/854,225, filed on Oct. 24, 2006.

(51) Int. Cl.
*G01R 31/00* (2006.01)

(52) U.S. Cl. .................. 324/762.01; 324/500

(58) Field of Classification Search ........... None
See application file for complete search history.

(56) References Cited

U.S. PATENT DOCUMENTS

| | | | |
|---|---|---|---|
| 4,688,223 A | 8/1987 | Motika et al. | |
| 4,744,084 A | 5/1988 | Beck et al. | |
| 5,095,262 A | 3/1992 | Henley et al. | |
| 6,169,408 B1 * | 1/2001 | Kantor et al. | 324/754.23 |
| 6,442,720 B1 | 8/2002 | Koprowski et al. | |
| 6,956,365 B2 * | 10/2005 | Niv et al. | 324/750.02 |
| 7,323,888 B1 | 1/2008 | Colvin | |
| 7,555,688 B2 | 6/2009 | Alvamani et al. | |
| 7,821,276 B2 | 10/2010 | Swenton et al. | |
| 2008/0284453 A1 | 11/2008 | Swenton et al. | |

OTHER PUBLICATIONS

"U.S. Appl. No. 12/122,310, Non Final Office Action mailed Dec. 30, 2009", 6 pgs.
"U.S. Appl. No. 12/122,310, Notice of Allowance mailed Jun. 22, 2010", 8 pgs.
"U.S. Appl. No. 12/122,310, Response filed Mar. 29, 2010 to Non Final Office Action mailed Dec. 30, 2009", 11 pgs.
"U.S. Appl. No. 12/122,310, Response filed Dec. 1, 2009 to Restriction Requirement Sep. 22, 2009", 7 pgs.
"U.S. Appl. No. 12/122,310, Restriction Requirement Sep. 22, 2009", 6 pgs.
Nikawa, K, "Optical Beam Induced Resistance Change (OBIRCH): Overview and Recent Results", IEEE, WEE4, (2003), 742-743.

(Continued)

*Primary Examiner* — Vinh Nguyen
(74) *Attorney, Agent, or Firm* — Schwegman, Lundberg & Woessner, P.A.

(57) ABSTRACT

Systems, methods, and computer readable media storing instructions for such methods relate to generating test vectors that can be used for exercising a particular area of interest in an integrated circuit. The test vectors generally include a non-overlapping repeating and/or predictable sequence of care bits (a care bit pattern) that can be used by a tester to cause the exercise of the area and collect emissions caused by exercising the area. Such emissions can be used for analysis and debugging of the circuit and/or a portion of it. Aspects can include providing a synchronization signal that can be used by a tester to allow sensor activation at appropriate times.

6 Claims, 5 Drawing Sheets

OTHER PUBLICATIONS

Polonsky, S, et al., "Non-Invasive Timing Analysis of IBM G6 Microprocessor L1 Cache using Backside Time-Resolved Hot Election Luminescence", IEEE International Solid-State Circuits Conference, (2000), 2 pgs.

Tsang, J C, et al., "Time-Resolved Optical Characterization of Electrical Activity in Integrated Circuits", Proceedings of the IEEE vol. 88, No. 9, (Sep. 2000), 1440-1459.

Vickers, J S, et al., "Time-Resolved Photon Counting System based on a Geiger-Mode InGaAs/InP APD and a Solid Immersion lens", IEEE, WO3, (2003), 600-601.

Woods, Gary L, et al., "Spectrally-and Temporally-Resolved Dynamic Emission from CMOS ICs", IEEE, (2003), 598-599.

\* cited by examiner

SYSTEM TO CONTROL INSERTION OF CARE-BITS IN AN IC TEST VECTOR IMPROVED OPTICAL PROBING

CROSS REFERENCE TO RELATED APPLICATIONS

This application is a divisional of U.S. patent application Ser. No. 12/122,310, filed on May 16, 2008, now U.S. Pat. No. 7,821,276, which is a continuation of U.S. patent application Ser. No. 11/877,516, filed on Oct. 23, 2007, now abandoned, which claims benefit under 35 U.S.C. §119(e) of U.S. Provisional Application No. 60/854,225, filed on Oct. 24, 2006, all of which applications are incorporated by reference in their entirety herein.

TECHNICAL FIELD

The present invention relates to the generation of test patterns (vectors) for IC operational testing, and more particularly to the efficient generation of test vectors that exercise circuit nodes and that can be synchronized with physical scanners for testing ICs.

BACKGROUND ART

For both IC debug and failure analysis, a goal is to understand a root cause of a failure. For debug analysis, the root-cause information can be provided to the design engineers who make appropriate changes to the mask set. In failure analysis, the data can be provided to the IC fabrication facility to effect changes directed toward improving yield and/or reliability. In either case, scan-based electrical test is usually the first tool used to diagnose a problem. Automatic test pattern generation (ATPG) can be used to sensitize defects in order to localize them. In many cases, the diagnostic information returned from such ATPG tests is inconclusive in localizing a problem, so that further, more refined testing by the physical probing of the signals on an IC chip is indicated. As will be discussed below, electrical design-for-test (DFT) features such as a scan-based architecture will partially localize a problem but even when supplemented by diagnostic programs can be insufficient for complete localization.

Scan testing is usually for digital circuitry made up of blocks of combinatorial logic alternating with registers made up of latches that store logical states (0's and 1's are represented by corresponding ranges of voltage levels). This is sometimes referred to as a register-transfer description. Signals propagate from one register to a next register through a block of combinatorial logic, with the register to register transfer being timed by a clock pulse. In between clock pulses, the latches retain logic states. Registers, and corresponding latches, that accept input logic states for a block of digital circuitry can be "source registers" and "source latches," respectively. Electrical testing involves testing logic circuitry by applying a set of logical 0's and 1's to a set of source latches, and observing the resulting logical 0's and 1's at a set of sink latches. A sequence of ordered sets of such logical inputs is often referred to as a test vector. Sink latches can be observed after one or wore clock pulses. As digital IC integration levels increase, it is often desirable to be able to test individual sub-blocks of digital circuitry on an IC that are not directly accessible by the IC's operational input and output ports. Boundary-scan methods can overcome this problem by surrounding inputs and outputs of a digital circuit sub-block to be tested with a boundary-scan shift register as illustrated by the example shown in FIG. 1. Boundary-scan testing involves serially loading a set of inputs through a serial input port 403 into that part of the boundary-scan register that is configured for connection to the inputs of the circuit block to be tested, designated as 405 in FIG. 1. These inputs are then clocked through the circuitry to be tested 405, and the corresponding outputs are captured in that part of the boundary-scan shift register that is configured to be connected to circuitry outputs 402B. Subsequently, the captured outputs can be clocked out of the boundary-scan register and serially read at serial output port 404. Circuitry inputs and outputs are usually configured with multiplexers (electronic two-to-one selector switches, not shown) so that they can be connected with a boundary scan register in an IC test mode, and connected with the other IC logic circuitry in an operational IC mode. Often the boundary scan register consists of latches that normally operate as parallel registers when the IC is in service mode, along with associated logic so that they can function as serially connected latches in boundary-scan test mode. Often the clock input to the circuit to be tested is preempted by an external tester in test mode, in order to coordinate the timing of the boundary-scan register logic-state loading and unloading for the logic sub-block to be tested.

Physical IC testing is distinguished from electrical IC testing in that it does not make use of operational IC outputs, or boundary-scan outputs. Physical IC testing directly measures electrical waveforms at nodes within the IC, or measures other physical manifestations such as electromagnetic radiation to infer electrical waveforms, typically in response to test vectors provided at an IC's operational and/or boundary-scan inputs.

There are several methods of probing on-die electrical waveforms, including: (i) direct electrical/mechanical probing; (ii) electron-beam probing; and (iii) optical probing. The direct mechanical probing of on-die electrical signals, performed by placing very sharp probe tips on the nodes of interest, is sometimes impossibly difficult. Often, such nodes are designed to drive capacitive loads on the IC of a few 10 s of fF and would be unacceptably loaded by the capacitance of electrical probes, thereby perturbing circuit functioning. Node access can also present problems due to the large numbers of metal layers, and to the extremely small size of the nodes of interest on typical ICs. Flip-chip packaging only compounds the access problem. Electron-beam probing has historically been used, but it suffers from the same problems of access as do mechanical probes. Other techniques such as SQUID microscopy can have niche applications as well. Physical IC testing is typically used after initial electrical testing. This is because, compared to electrical testing, physical testing tends to be more expensive in terms of testing time and testing equipment. An engineer might be able to explore only one or a few test hypotheses per day using physical testing, whereas dozens could be explored in the same time via electrical testing, and so it is useful to rule out false hypotheses by electrical testing, where possible.

Optical probing is a common technique for the physical fault isolation and debug of integrated circuits. According to some techniques, the device-under-test (DUT) is put into a repetitive test loop, while data such as voltage waveforms for a node of interest, are collected non-invasively through the backside of the silicon IC die. A performance-limiting factor in optical probing can be often the long averaging time required to accumulate enough test data. This averaging time is directly proportional to the length of the test pattern (number of vectors and clock period). Thus, significantly shortening the test loop can greatly improve the performance of IC test systems using optical probing. For optical probing, the number of "care-bits" (i.e. bit sequences that diagnostically exercise a sink node of interest (i.e. a sink node whose logical state may indicate a performance fault for the digital circuitry under test) is usually quite small, on the order of a few 10 s of test vectors. For physical IC testing, any logic device having transistors switchable between logic states (a "node") can be observed. The terms "sink latch" and "sink node" will be used interchangeably in the context of physical IC testing. FIG. 2 illustrates a sink node 201 in a digital circuit sub-block 200. By loading the scan chains with repetitions of these relatively few care-bits, one can dramatically reduce the time required to repetitively exercise the particular circuit node being probed.

Today, much optical probing is done through the back side of silicon ICs, using infrared light to which silicon is transparent, and viewing the transistors from "underneath." Such techniques induce negligible loading on the circuitry under test and have test access to every transistor on a die, thus eliminating some roadblocks of the previously discussed probing techniques. A drawback of optical probing is that the signals acquired can be very weak. The low signal-to-noise ratio (SNR) requires the DUT to be put into a repetitive looping state; so that the optical signal can be averaged over very many such loops. A limitation, from a user's point of view, is the time it takes to acquire enough such "signal" to analyze functionality of the probed point, as this time usually limits the number of nodes that can be probed.

Time-resolved emission (TRE) data from optical probing can be acquired on commercially-available probing systems. This technique is non-invasive and can be used to collect high bandwidth signals (5 ps timing resolution is regularly obtained) through the back side of the silicon IC. TRE is based upon the observation that when a CMOS circuit switches, it can emit a faint pulse of light that can be detected and used to determine, with high accuracy, the time at which the circuit switched. The origin of this pulse of light is thought to be "hot" electrons and holes in the transistors, which emit blackbody radiation, as do hot ovens and the sun. These light pulses, which can be so faint as to require single-photon counting detection, can mark the rising and falling edges of a waveform.

Because these small light pulses mark signal waveforms, it is possible to acquire a waveform that represents the electrical waveform of the node, without an electrical contact between a probe and the node. However, a number of light pulses must be collected before such waveform can be accurately inferred.

A time to acquire the waveform, $T_{acq}$, depends on a number of parameters, as described by equation (1):

$$T_{acq} = T_{loop}\left[\frac{\Delta t_{jitter}}{\Delta t_{res}}\right]^2 \frac{(R_{dark}\Delta t_{jitter})}{P_{sig}^2}, \quad (1)$$

$T_{loop}$ is a loop length (typically 10 μs-1 ms) that described how often a care bit pattern is repeated; $\Delta t_{jitter}$ is a relative timing jitter of the detector (50 ps typ.) and the logic state transition time of a sink node of interest; $R_{dark}$ is the dark count rate (30 KHz typ.); $P_{sig}$ is the expected number of photons within a peak per loop ($10^{-3}$ to $10^{-6}$ typ.); and $\Delta t_{res}$ is a desired timing resolution, relating to how accurately a given waveform is to be determined (5-50 ps is typical). Given these numbers, the acquisition times typically can range from less than 1 second to about 40 hours, although typical acquisitions range from 2-20 minutes. Longer acquisition times are usually prohibitive, although there are a few accounts of 24-hour acquisitions.

According to equation (1) above, the acquisition time scales linearly with the loop length, so reducing the loop from the above-quoted 10 μs minimum to 100 ns, for instance, could yield a 100× improvement in acquisition times. So far, loop compression has typically not been applied, except in specialized cases when built-in self test (BIST) routines could be optimized, as in the case of memory circuits. Loop compression (described below) can allow better test efficiency and enable use to probe signals that otherwise would be too weak. Also, $$\frac{\Delta t_{jitter}}{\Delta t_{res}}$$

represents the signal to noise ratio (SNR), so that the SNR achieved during probing scales as the square root of the probing time. FIG. 3 presents experimentally measured data for an optically measured signal corresponding to logic state transitions for a repetitively excited circuit node, integrated for various test times. The improvement in measured signal amplitude and timing precision with increasing test time is evident.

The number of permutations for logic state values of a test vector can be very large, growing exponentially according to the number of source latches. LBIST generates a set of pseudo-random latch value patterns for the source latches. Expected values of sink latch logic values can be derived from a logic circuit description, corresponding to each particular set of source latch logic values. A digital circuit can then be tested with the sets of source latch logic states, typically by loading into a boundary-scan register, and the resulting sink latch logic states (typically after being read by off-loading a boundary scan register) can be compared with the expected logic states for the sink values. A discrepancy in test results and expected results indicates a performance fault for the digital circuit. Afterward a new set of pseudo-random latch values (test vector) can be loaded into the boundary-scan register and the process repeated. In some cases, sets of pseudo-random latch values with greater numbers of logical 1's or 0's, in order to more efficiently attempt to trigger sink node responses representing circuit performance faults.

One loop compression technique is described in U.S. Pat. No. 6,442,720 issued on Aug. 27, 2002 to Koprowski et al. (hereinafter "Koprowski"). According to Koprowski, sink nodes of interest can be identified by observing which sink nodes tend to fail. Test vectors corresponding to sink node failures are used to generate subsequent test vectors by appending a minimally time shifted (in terms of clock pulses) version of the original test vector to itself, such that the scan chain is loaded with interleaved versions of the test vector causing the sink node failure. Thus, the test vector compression scheme of Koprowski increases the number of times a given failure can be exercised, but the precise timing of when that failure can be exercised varies because the interleaving causes the triggering event to occur on irregular intervals (see FIG. 8 of Kaprowski). Referring to equation (1) this compression scheme reduces the value of $T_{loop}$, thereby proportionally reducing acquisition time, $T_{acq}$.

Regarding the detection of sink node logic state transitions by optical techniques, the number of photons per transistor per switching event decreases with each process generation in part due to shrinking transistor geometries and logic state noise margins, although the emission is predicted to be present in all process geometries for the foreseeable future. Left unchecked, this trend could result in unacceptably long acquisition times for testing.

As IC devices continue to scale, it will be useful to supplement improvements in TRE system performance by shortening the test loops being used. The benefits of loop compression should apply independently of any other voltage or other setup conditions. In cases where the acquisition time is already adequate, one can average the data for many more loops in the same acquisition time, yielding much better signal to noise ratios (SNR). This can allow the extraction of additional information that normally would require an impractically long time to acquire, such as rising edges due to rush-through current; waveforms from PMOS transistors; leakage; and glitches. Loop compression should also benefit other probing techniques such as laser voltage probing (LVP).

Additionally, it is desirable to be able to improve test instrument sensitivity by optimally synchronizing the optical sensing process with the timing of photon emissions. $T_{ack}$ of equation (1) is proportional to the cube of $T_{jitter}$, so reducing $T_{jitter}$ in equation (1) is desirable.

SUMMARY OF THE INVENTION

Embodiments of the present invention provide methods and apparatuses to efficiently introduce care-bit patterns at regular intervals into test vectors for IC testing. ("Care-bit patterns" are subsets of test vectors that exercise a sink latch of interest.) In further aspects, trigger signals also can be generated for use in synchronizing care-bit patterns with optical scanning at predictable times.

Some embodiments of the invention comprise methods of generating test vectors dense with care-bit patterns by repeatedly appending time shifted versions of a care-bit pattern to itself. The time shifting units can correspond to clock periods for the digital circuitry to be tested. The duration of the time shift can range from the length of the care-bit pattern to an arbitrary duration through the intervening insertion of arbitrary bits. Generally, an appropriate time-shift interval is determined so that logical transitions in a sink node of interest can be predictably synchronized with the optical scanning of the sink node, taking into account, at least, the interval associated with initially loading the boundary-scan register.

In some aspects, the duration of the time shift between insertions of care-bit patterns can be fixed or variable. According to some such aspects, variable time shifts can be used to search for a time shift value that maximizes an optical scanner response for the sink node, after which the duration of the time shift can be fixed at that time shift value. The scan load section can be followed by a loop consisting of a combination of scan-in stimuli, scan cycles and release events at the appropriate intervals to launch the transitions. According to some embodiments, the release event is a synchronization pulse from an external source, such as front the optical scanner, although usually the synchronization pulse would be a clock from a test generator source.

Further aspects comprise software and/or firmware configured to implement methods as described above using digital circuitry and/or digital processors. Other aspects can include providing test vectors for which a trigger event can be algorithmically determined, although such algorithmic determination would not be considered preferable for most circumstances. Other features and aspects of the invention will become apparent from the following detailed description, taken in conjunction with the accompanying drawings, which illustrate, by way of example, the features in accordance with these described inventive aspects. The summary is not intended to limit the scope of the invention.

The figures provided are exemplary and representational and may not be drawn to scale. Certain proportions thereof may be exaggerated, while others may be minimized. The figures are intended to illustrate various aspects and implementations of the invention that can be understood and appropriately carried out by those of ordinary skill in the art. The figures are not intended to be exhaustive or to limit the invention to the precise form disclosed. It should be understood that the invention can be practiced with modification and alteration.

DETAILED DESCRIPTION

Unless defined otherwise, all technical and scientific terms used herein have a meaning consistent with a common understanding of those of ordinary skill in the art(s) to which this invention belongs.

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Some portions of the detailed description that follows are presented in terms of procedures, steps, logic blocks, processing, and other symbolic representations of operations on data bits that can be performed on computer memory. A procedure, computer executed step, logic block, process, etc., are here conceived to be self-consistent steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or various combinations or sub-combinations thereof.

Figure 2:
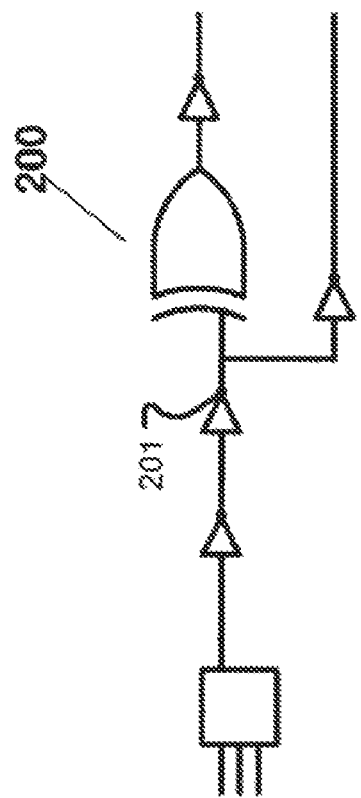
FIG. 2 illustrates a logic diagram for a portion of an IC, with a sink node of interest indicated.

A device analyzed in an illustrative example is an inverter in a 90 nm silicon-on-insulator (SOI) Athlon64 microprocessor IC. FIG. 2 illustrates a circuit node 201 of interest within a portion of a circuit for such an IC. The node 201 was probed using TRE.

Figure 3:
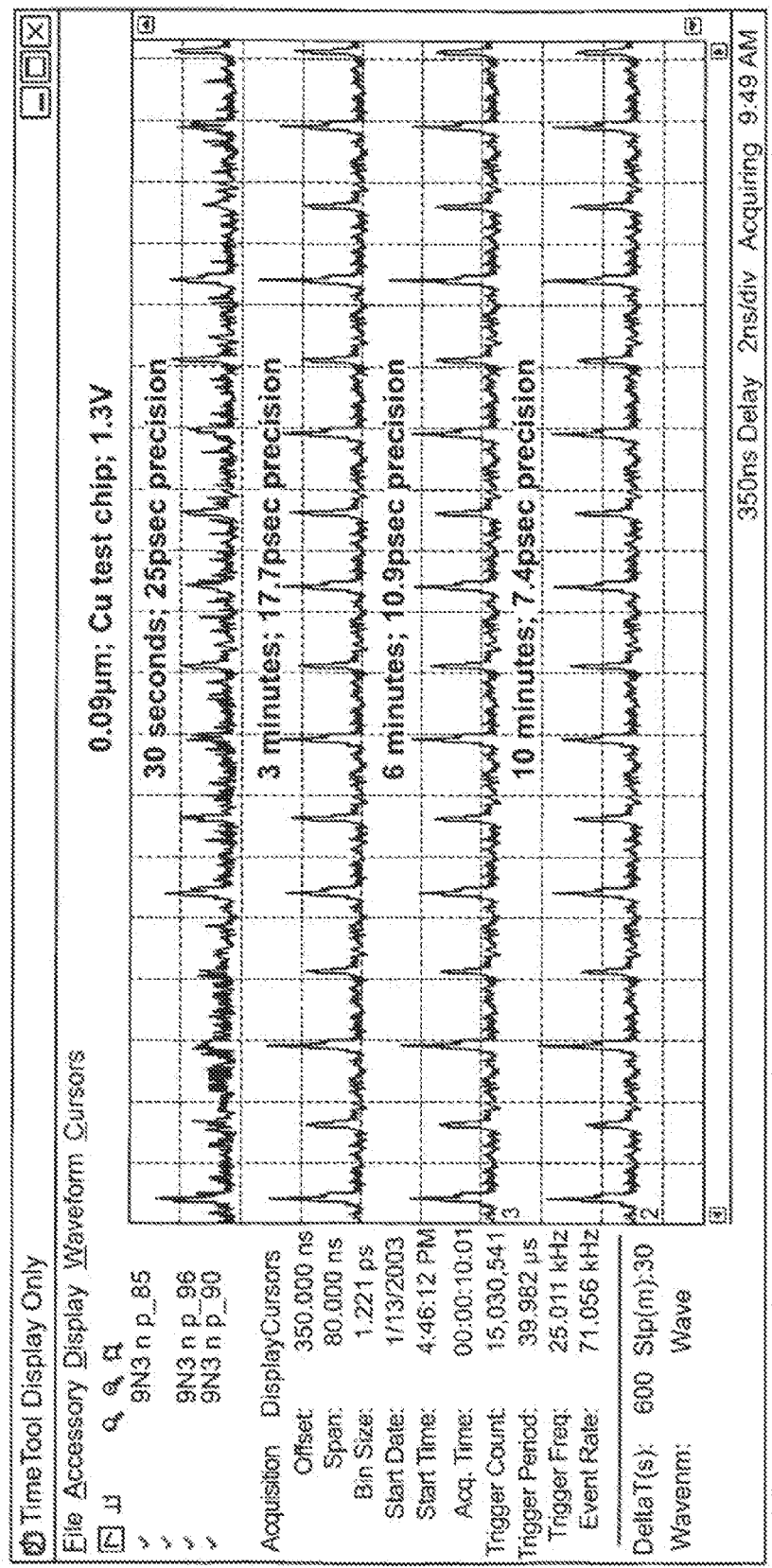
FIG. 3 illustrates waveforms for an IC node of interest obtained by a TRE probing system using various signal acquisition times.

FIG. 3 demonstrates that increasing temporal resolutions and signal sensitivities are achieved with increasing test acquisition times through the optical signal averaging of multiple test loops at node 201. In this example, a scan chain frequency of 200 MHz was selected. The uncompressed test loop contained 4500 vectors, resulting in a loop time of 22.5 µs.

In an example, systems and methods can be used to generate test vectors that cause a specific sink node (e.g. node 201 of FIG. 2) transition to occur repeatedly in circuit (i.e. test vectors with many instances of care-bit patterns for the node of interest). These repeated care-bit patterns enable backside probing equipment to acquire circuit images more efficiently and/or precisely by reducing $T_{loop}$ in equation (1). The care-bit pattern sequences are repeatedly inserted into an arbitrary test vector bit sequence at fixed intervals (measured in terms of clock cycles) as shown by the example in Table 1.

TABLE 1

| Original test vector: | xxxxxxxxxxxxxxxxxxxxxxxxxxxxxxxxxxxxxxxxxxxxxxxxxxxxxxxxxxxxx . . . |
|---|---|
| Care-bit pattern: | ccccc |
| Inserted care-bit patterns: | cccccxcccccxcccccxcccccxcccccxcccccxcccccxcccccxcccccxcccccxc→time |

In the example of Table 1, the care-bit pattern is inserted into the test vector with a fixed six clock cycle interval. According to other embodiments, the interval can be adjusted upward (downward repetition frequency adjustment) if necessary, for example, to synchronize with an optical scanner, as shown in Table 2, illustrating a ten clock cycle interval.

TABLE 2

| Original test vector: | xxxxxxxxxxxxxxxxxxxxxxxxxxxxxxxxxxxxxxxxxxxxxxxxxxxxxxxxxx . . . |
|---|---|
| Care-bit pattern: | ccccc |
| Inserted care-bit patterns: | cccccxxxxxcccccxxxxxcccccxxxxxcccccxxxxxcccccxxxxxccccc → time . . . |

In some aspects, the interval can be made variable, with a minimal interval being the length of the care-bit pattern itself. Table 3 provides an example.

TABLE 3

| Original test vector: | xxxxxxxxxxxxxxxxxxxxxxxxxxxxxxxxxxxxxxxxxxxxxxxxxxxxxxxxxx . . . |
|---|---|
| Care-bit pattern: | ccccc |
| Inserted care-bit patterns: | cccccxcccccxxxxxcccccxcccccxxxxxxxxxxcccccxcccccxccccc → time . . . |

Variable care-bit insertion intervals can be useful when the care-bit insertion for identifying improved timing for synchronization timing with optical scanning equipment by for example establishing an interval between an IC clock pulse and maximum scanned light emission level from a sink node, from which a fixed interval can be determined. In a particular example of a scan chain implementation, if for example, an A clock of an LSSD scan cell were used as a triggering event, one of skill in the art would recognize that there may be a delay between the triggering event and an optimal time for scanning for energy emitted during the failure event at the sink node. This delay may vary depending on the circuit and the test setup, and can be determined by experimentation with the amount of delay.

Whether fixed or variable care-bit insertion intervals are used, a minimum insertion interval should be equal to or greater than the care-bit pattern length, so that the care-bit patterns are not corrupted by overlapping, and testing for such corruption is not required. And in general operation, the fixed interval allows a regular timing to be maintained with the synchronization pulses, which is a practical advantage during testing.

As discussed above, according to embodiments of the invention a method of generating care-bit pattern dense test vectors comprises repeatedly appending time shifted versions of a care-bit pattern to itself. The time shifting units correspond to clock periods for the digital circuitry to be tested (a care-bit pattern can be determined as described above.) The duration of the time shift can range from the length of the care-bit pattern to an arbitrary duration through the intervening insertion of arbitrary bits. The appropriate time-shift intervals can be determined so that logical transitions in a sink node of interest are synchronized with the optical scanning of the sink node, taking into account the interval associated with initially loading the boundary-scan register. The scan load section can be followed by a loop consisting of a combination of scan-in stimuli, scan cycles and release events at the appropriate intervals to launch the transitions. The release event can be a synchronization pulse from the optical scanner, as described with respect FIG. 6. Aspects of these examples can be implemented in software and/or hardware. Hardware or hybrid software/hardware embodiments can have advantages relating to faster operation and more precise synchronization.

Figure 1:
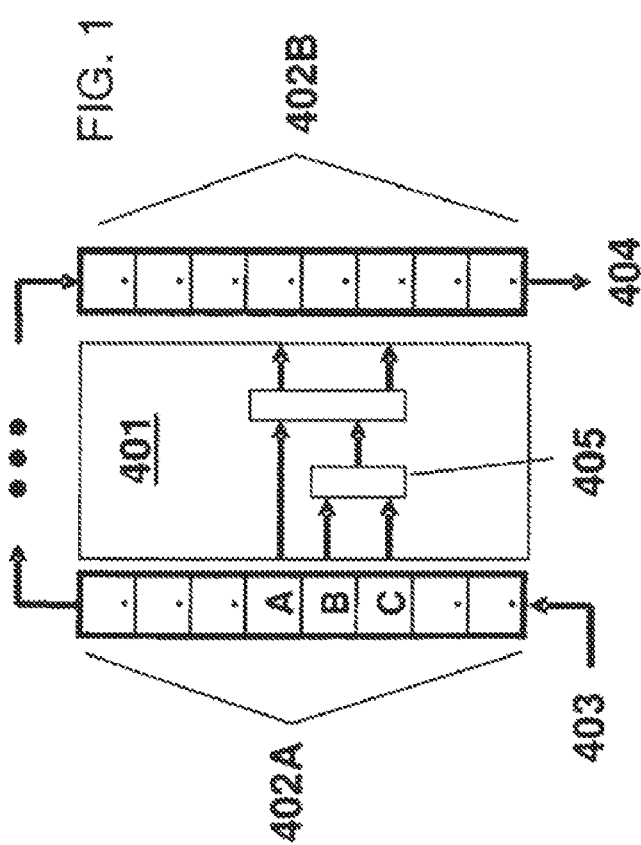
FIG. 1 illustrates a sub-block of digital circuitry surrounded by a boundary scan register for electrical testing.
Figure 4:
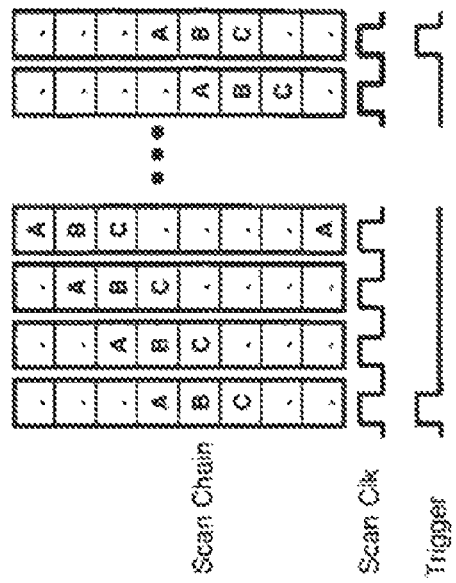
FIG. 4 illustrates progress of a test vector through a scan chain.

Table 4 provides portions of exemplary Standard Test Interface Library (STIL) test code for a fixed-insertion-interval embodiment using a hypothetical 3 bit care bit sequence. Aspects of a structure for such a scan chain implementation is illustrated in FIG. 1. FIG. 4 also illustrates how the care bits A. B. C, move through the scan chain according to transistors of the scan CLK, and the separate trigger pulse is generated at an interval greater than the care bit sequence. For simplicity, we'll assume the transition is launched by an A-clock and there are no inversions between the boundary scan-in and the latches in the boundary scan register. Details such as setting up the boundary scan register state are known to one of ordinary skill in the art, and are omitted. As can be seen, a method according to inventive aspects includes loading the scan chain with a test vector comprising the care bit sequence and upon shifting the care bit sequence to a position where the next trigger of the A clock will release the last care bit of the sequence to the combinational logic. That A clock is then triggered and a release pulse is sent for triggering the scanner. The scan chain then shifts the test vector until the last bit of the care sequence is again in position, and repeats.

TABLE 4

Test_sequence: (load in ABC....ABC into the scan string)
   Stim scan-in to A;
   Scan Cycle ;
   Stim scan-in to B;
   Scan Cycle ;
   Stim scan-in to C;
   Scan Cycle ;
   // repeat until scan chains are loaded up to the last care bit.
   Begin loop:
      Stim scan-in to A;
      Pulse Scan clock (internal design release event and TRE capture point);
      Stim scan-in to B;
        Scan Cycle ;
      Stim scan-in to C;
      Scan Cycle ;
   End loop;
End Test_Sequence;

The present approach helps in addressing a shortcoming of the present support in STIL for transition excitation for optical probing, and similar technologies. Currently, STIL does not provide a mechanism to differentiate a release event clock pulse from a non-release event clock pulse. In other words, a release event may be triggered by pulsing the A clock in the scan chain at a time after shifting in of the care-bit sequence. However, there is no a priori distinction in STIL between a release event A clock pulse and any other A clock pulse that would be used during shifting of data through scan latches during testing.

Software can manage the state of the boundary-scan registers to provide a sequence of consistently timed release events. As such, these release events can be conceptualized as being consistently located in fixed positions with respect to the test vector that comprises a sequence of care bit patterns used for configuring latches that affect whether or not a particular portion of a circuit will exhibit potential failure symptoms. For example, the release events may be either always the first or the last event in the loop (i.e, in one care bit pattern sequence repetition of many). While potentially sacrificing some degree of test vector compaction by avoiding the overlapping care bit patterns generated by the algorithm taught in Koprowski, a fixed insertion interval can better facilitate the acquisition of data at a scanner by enabling a simplifying assumption about the timing of release events. Such an assumption can makes programming test equipment more efficient. Jitter may also be reduced by these exemplary aspects.

In an example, an initial iteration of the loop requires shifting in of the test vector such that the first care bit pattern in the test victor is at a point in the scan chain where the next shift operation will activate the circuit portion though to be failing. In the present example, the circuit portion is thereafter activated by an A clock pulse (i.e., the scan data presents itself to the combinatorial logic after the latch). Thus, the A clock pulse can be considered a release event to trigger activation of the scanner. Thereafter, the B clock is activated to complete the shift operation. The next iteration of the loop comprises shifting the test vector by alternatively activating the A and B clocks of the typical LSSD cell until the care-bit pattern is again appropriately positioned. The A clock pulse is then activated, and used as a trigger for the scanner.

In sum, the test vector is shifted through latches of the scan chain without capturing the output of the combinatorial logic by activating the system clock. Instead, the test vector is continually shifted through, and release events are triggered appropriately at the beginning or at the end of each care bit pattern (i.e., the end of one care bit pattern may signal the beginning of the next, in a situation where there is no extra padding with don't care values in the test vector).

Unlike a non-fixed care bit pattern repetition, the fixed length repetition only needs to account for one instance of latch care bits (i.e., there are not multiple release events clustered according to how a particular sequence of care bits does or does not lead to additional sequences of care bit patterns when overlapped with itself, as is done in Koprowski). Also, because there is a fixed number of scan cycles between releases during normal usage, only a single release event is required for a fixed iteration and this can always be located at a predictable point in the loop. By contrast, the non-fixed iteration includes a release for each transition made possible by pre-loading overlapped latch care bits. However, such releases do not occur at regular or easily predicted intervals. Further, they do not make for easy synchronization of test equipment. Examples of how these aspects may be implemented are now described with respect to FIGS. 5-7.

Figure 5:
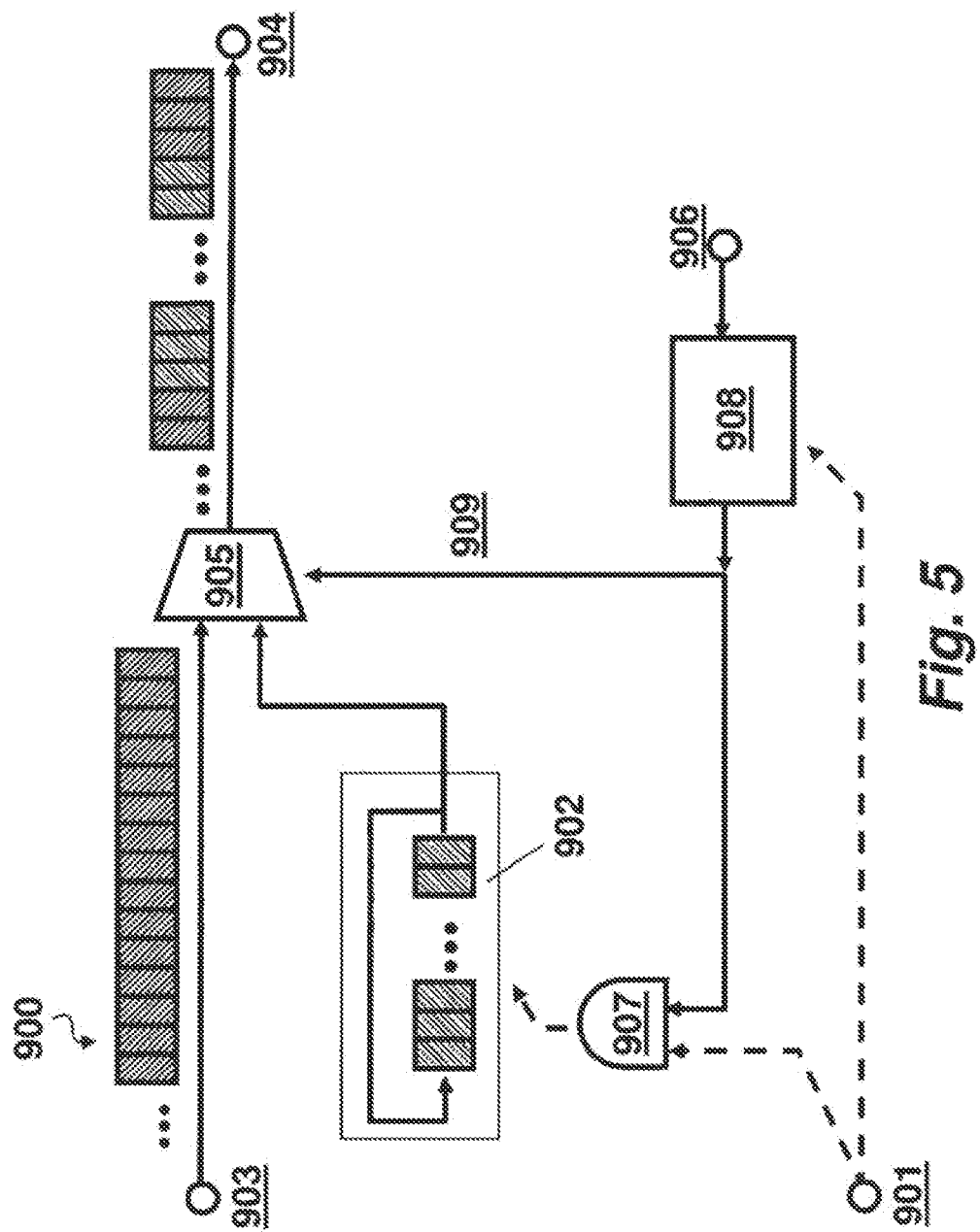
FIG. 5 illustrates a block diagram of a test vector generator according to exemplary aspects.

FIG. 5 is a block diagram of a hardware embodiment to insert care-bit patterns, such as the 3-bit pattern described above, into test vectors. Two-to-one multiplexer 905 accepts inputs from either an ATS test vector generator port 903 or a cyclical shift register 902, and transmits them to an output port 904 (for receipt by the DUT). Additional signal conditioning and/or translation circuitry can optionally be inserted between ATS test vector generator input port 903 and the two-to one multiplexer 905, and/or the two-to-one multiplexer 905 and the output port 904. Cyclical shift register 902 has a care bit pattern loaded into it according to various means that are known to one of ordinary skill in the art. The shift register 902 can be implemented in hardware, software or a combination thereof. The length of cyclical shift register 902 can be configured electrically or otherwise to match the length of a loaded bit-care pattern. Line 906 signals a release event trigger by going to a high logical ("logical 1") state that activates counter 908. In response, counter 908 drives line 909 high for a number of clock pulses determined by the configured length of shift register 902. Two-to-one multiplexer 905 selects the cyclical shift register 902 input when line 909 is in a logical 1 state, and selects the ATS test vector generator input port 903 when line 909 is in a logical 0 (low logical) state. Line 909 is also input to AND gate 907 to enable or disable the clock input 901 to cyclical shift register 902. Clock input 901 also drives counter 908. In this embodiment, a release event trigger causes the insertion of a care-bit pattern into an ATS test vector, coincident with the release event trigger.

Figure 6:
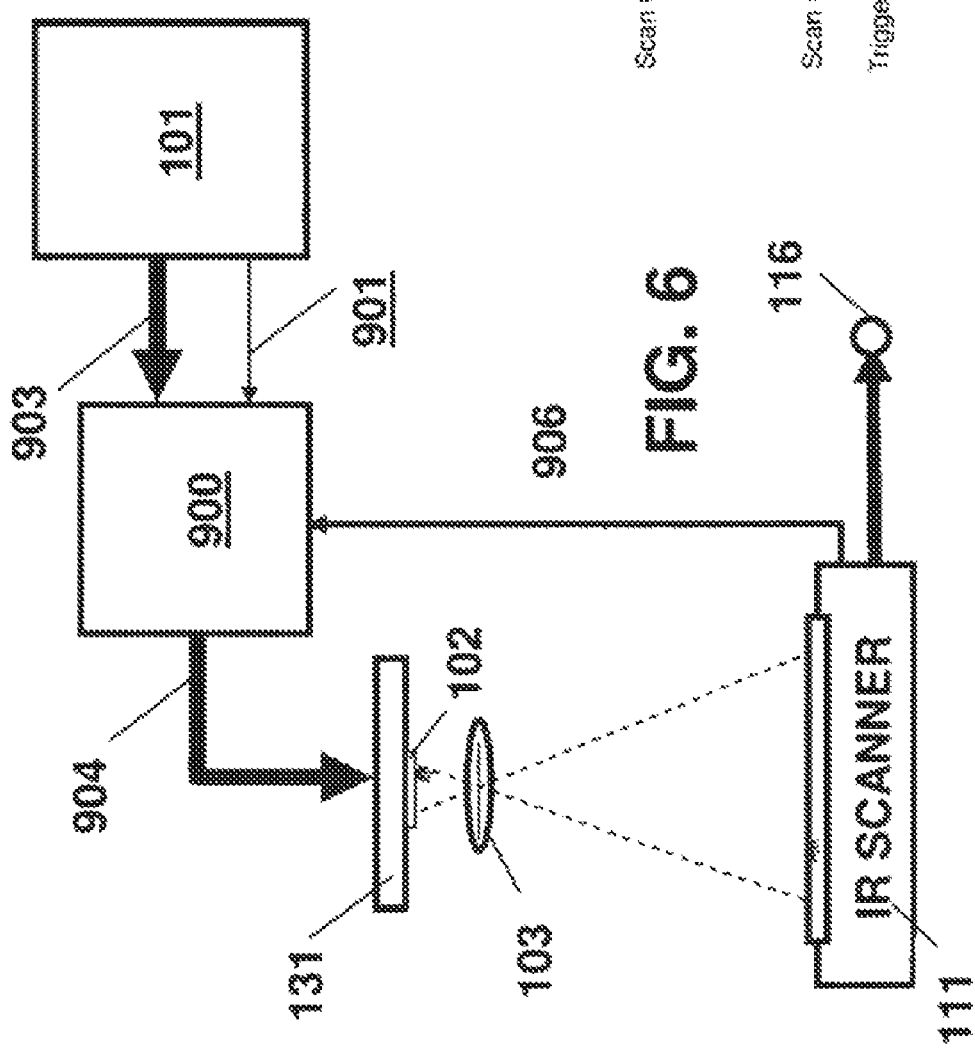
FIG. 6 illustrates a system in which the test vector generator can be used.

FIG. 6 is a block diagram of the test vector generator 900, described above and operationally coupled to ATE 101, optical scanner 111, and DUT 102 (shown interfaced by fixture 131). In this example, the optical scanner 111 drives release event trigger line 906 to initiate the insertion of a care-bit pattern in synchronization with optical scanning. In other examples, trigger line 906 can be driven from the test vector generator 900, based on timing of repetitions of the care bit pattern. The scanner outputs detected light emission information at output 116.

The setup illustrated in FIG. 6 can operate using time resolved emission (TRE) probing techniques implemented by tools and systems such as the Picosecond Imaging Circuit Analysis (PICA) tool (from Schlumberger, LTD, New York, U.S.A.) or the Credence Emiscope (from Credence Systems Corporation, 1421 California Circle Milpitas, Calif. 95035. U.S.A.). The transistor layer of the DUT can be imaged through the silicon backside for visual IC feature identification and navigation purposes. Photons emitted by switching transistors are also collected through the backside and detected by a single-photon avalanche diode ("nPMT"). The ATE exercises the DUT and provides a trigger pulse as a timing reference once per test loop.

Figure 7:
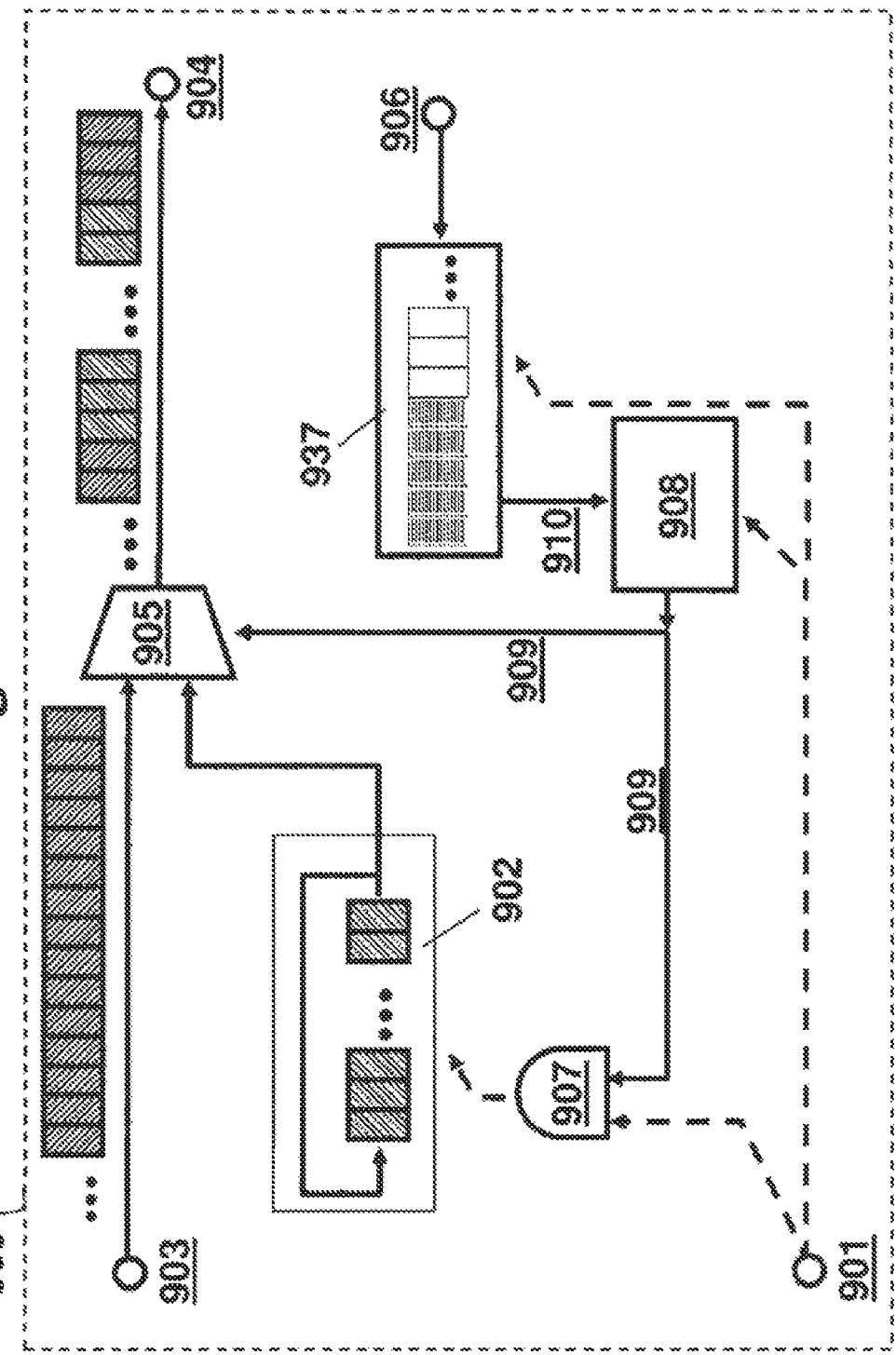
FIG. 7 illustrates another example of a test vector generator providing additional functionality that may be useful in optical scanner synchronization.

FIG. 7 is a block diagram of a further example in which the release event trigger is delayed by a programmable length shift register 937 before actuating counter 908 through trigger 910. (Alternatively, shift register 937 may also be implemented as a programmable timer.) Otherwise, this embodiment functions as described in relation to FIG. 5. The embodiment of FIG. 7 features the option to delay the insertion of a care-bit pattern into a test vector by an adjustable number of clock cycles. This option can be useful to further adjust synchronization between scanning and photon emission from a node of interest. Once the number of clock cycles has been adjusted or otherwise selected, the number of clock cycles can be fixed to provide a fixed loop to aid in synchronization through predictable triggering events.

The algorithm, method, and apparatus (inventive aspects) can be generalized for application beyond the conventional LSSD scan cell design, which generally comprises a master latch and a slave latch, where in test mode, the master latch is clocked by an A clock, and receives scan in data, the slave is activated by a B clock to receive scan in data, and by a system clock to receive scan out data. The inventive aspects can be applied in any system where a desired configuration of a potentially failing portion of a circuit can be repeatedly achieved by providing a fixed-length bit sequence repeated at a regular interval to configure the portion of the circuit.

It should be understood that the invention can be practiced with modification and alteration within the spirit and scope of the appended claims. The description is not intended to be exhaustive or to limit the invention to the precise form disclosed, nor to limit the invention to the exemplary uses described. It should be understood that the invention can be practiced with modification and alteration and that the invention be limited only by the claims and the equivalents thereof. For example, many of the above aspects presented a fixed-length bit sequence, within which is a care-bit sequence selected to exercise a node of interest. A variation of this embodiment may include providing a care bit sequence within a larger bit sequence that causes exercise of the node of interest at times algorithmically determinable, such that a trigger signal to activate a sensor can be generated and provided to the sensor, such that the sensor is operable during an expected timeframe when photon emission will occur. An algorithmically determinable sequence may require additional processing capabilities and at least for that reason may not be preferable in most implementations.

The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art.

Those skilled in the art will recognize that the operations of the various embodiments may be implemented using hardware, software, firmware, or combinations thereof, as appropriate. For example, some processes can be carried out using digital circuitry or computers (generically referred to herein as computers or processors) under the control of software, firmware, or hard-wired logic. Software and firmware can be stored on computer-readable media. Some other processes can be implemented using analog circuitry, as is well known to one of ordinary skill in the art.

Therefore, it should be understood that the invention can be practiced with modification and alteration. The description is not intended to be exhaustive or to limit the invention to the precise form disclosed. It will be appreciated that, for clarity purposes, the above description has described embodiments of the invention with reference to different functional units and processors. However, it will be apparent that any suitable distribution of functionality between different functional units or processors. For example, functionality illustrated to be performed by hardware logic can be performed by one or more separate processors or controllers. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Additionally, although a feature may appear to be described in connection with particular embodiments, one skilled in the art would recognize that various features of the described embodiments may be combined in accordance with the invention. The term 'comprising' does not exclude the presence of other elements or steps.

The invention claimed is:

1. A system that includes a test vector generator and an optical scanner configured to load a scan chain of an integrated circuit with a test vector that includes a care bit pattern sequence within an arbitrary sequence of bits and to repeatedly exercise a sink node of interest of the integrated circuit and to optically scan the sink node for energy emitted during a failure event at the sink node, comprising:
   a register circuit configured to provide the care bit pattern sequence;
   selection circuitry to select between bits of an arbitrary sequence produced by the test vector generator and the care bit pattern sequence; and
   control circuitry that is activated by a trigger signal and that includes a counter to control selection by the selection circuitry.

2. The system of claim 1,
wherein the trigger signal is driven by the test vector generator to initiate insertion of the care-bit pattern arbitrary sequence into the arbitrary sequence at non-overlapping fixed clock cycle intervals.

3. The system of claim 1,
wherein the trigger signal is driven by the optical scanner to initiate insertion of the care-bit pattern into the arbitrary sequence in synchronization with optical scanning.

4. The system of claim 1,
wherein the trigger signal is driven by the test vector generator to initiate insertion of the care-bit pattern arbitrary sequence into the arbitrary sequence at non-overlapping variable clock cycle intervals with a minimum clock cycle interval being length of the care bit pattern.

5. The system of claim 1,
wherein the register is configured to act as a cyclical shift register loaded with the care bit pattern.

6. The system of claim 1,
wherein the register is configured to act as a cyclical shift register loaded with the care bit pattern; and
wherein the shift register and the counter are configured to be responsive to a clock signal.

* * * * *

UNITED STATES PATENT AND TRADEMARK OFFICE
CERTIFICATE OF CORRECTION

PATENT NO. : 8,120,378 B2
APPLICATION NO. : 12/873126
DATED : February 21, 2012
INVENTOR(S) : Swenton et al.

It is certified that error appears in the above-identified patent and that said Letters Patent is hereby corrected as shown below:

On face page 1, under "Title", in column 1, line 2, and in column 1, line 2 in specification, after "VECTOR" insert --FOR--, therefor On face page 1, under "Other Publications", in column 2, line 8, after "Restriction Requirement" insert --mailed--, therefor On face page 1, under "Other Publications", in column 2, line 9, after "Restriction Requirement" insert --mailed--, therefor On face page 1, under "Other Publications", in column 2, line 11, after "Nikawa," delete "K," and insert --K.,--, therefor On face page 2, under "Other Publications", in column 1, line 1, after "Polonsky" delete "S," and insert --S.,--, therefor On face page 2, under "Other Publications", in column 1, line 5, after "Tsang," delete "J C," and insert --J. C.,--, therefor On face page 2, under "Other Publications", in column 2, line 1, after "Vickers," delete "J S," and insert --J. S.,--, therefor On face page 2, under "Other Publications", in column 2, line 4, after "Woods, Gray," delete "L," and insert --L.,--, therefor In column 1, line 60, delete "wore" and insert --more--, therefor In column 2, line 38, delete "10 s" and insert --10s--, therefor In column 3, line 4, delete "10 s" and insert --10s--, therefor Signed and Sealed this
Twenty-ninth Day of January, 2013

David J. Kappos
*Director of the United States Patent and Trademark Office*

CERTIFICATE OF CORRECTION (continued)
U.S. Pat. No. 8,120,378 B2

In column 3, line 55, delete "described" and insert --describes--, therefor

In column 4, line 9, delete "use" and insert --users--, therefor

In column 5, line 55, delete "front" and insert --from--, therefor

In column 7, line 12, delete "e.g." and insert --e.g.,--, therefor

In column 7, line 30, delete "care-hit" and insert --care-bit--, therefor

In column 9, line 2, delete "A. B. C," and insert --A, B, C,--, therefor

In column 9, line 44, delete "priori" and insert --prior--, therefor

In column 9, line 63, delete "makes" and insert --make--, therefor

In column 10, line 1, delete "victor" and insert --vector--, therefor

In column 11, line 17, delete "Calif. 95035." and insert --Calif. 95035,--, therefor